United States Patent
Hong (10) Patent No.: US 9,349,782 B2
(45) Date of Patent: May 24, 2016

(54) ORGANIC LIGHT EMITTING DIODE DISPLAY

(71) Applicant: Samsung Display Co., Ltd., Yongin, Gyeonggi-do (KR)

(72) Inventor: Sang-Min Hong, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 346 days.

(21) Appl. No.: 13/662,896

(22) Filed: Oct. 29, 2012

(65) Prior Publication Data

US 2013/0328853 A1    Dec. 12, 2013

(30) Foreign Application Priority Data

Jun. 12, 2012    (KR) .......................... 10-2012-0062763

(51) Int. Cl.
*G09G 3/30* (2006.01)
*H01L 27/32* (2006.01)
*G09G 3/32* (2016.01)

(52) U.S. Cl.
CPC .......... *H01L 27/3265* (2013.01); *G09G 3/3208* (2013.01); *G09G 3/3233* (2013.01)

(58) Field of Classification Search
CPC ........................... G09G 3/3233; G09G 3/3208
USPC .................................................. 345/76, 214
See application file for complete search history.

(56) References Cited

U.S. PATENT DOCUMENTS

| 2010/0310974 A1* | 12/2010 | Lee | .................................... 430/5 |
| 2011/0024756 A1* | 2/2011 | Lee | .................................. 257/59 |
| 2011/0148855 A1* | 6/2011 | Kim et al. | ..................... 345/214 |
| 2011/0227893 A1* | 9/2011 | Bae et al. | ....................... 345/211 |

FOREIGN PATENT DOCUMENTS

| KR | 10-2011-0012275 A | 2/2011 |
| KR | 10-1034679 | 5/2011 |

* cited by examiner

*Primary Examiner* — Chanh Nguyen
*Assistant Examiner* — Yuzhen Shen
(74) *Attorney, Agent, or Firm* — Knobbe Martens Olson & Bear LLP (57) ABSTRACT

An organic light emitting diode (OLED) display including a substrate; a scan line formed on the substrate and applying a scan signal; a data line and a driving voltage line intersecting the scan line and respectively applying a data signal and a driving voltage; a switching TFT connected to the scan line and data line; a driving TFT connected to a switching drain electrode TFT and the driving voltage line; an OLED connected to the driving drain electrode; a storage capacitor connected between the driving voltage line and the driving gate electrode; and a boosting capacitor including a first boosting capacitor plate connected to the driving gate electrode and a second boosting capacitor plate overlapping the first boosting capacitor plate and connected to the scan line, where an area of the first boosting capacitor plate of the boosting capacitor is larger than an area of the second boosting capacitor plate.

13 Claims, 6 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2012-0062763 filed in the Korean Intellectual Property Office on Jun. 12, 2012, the entire contents of which are incorporated herein by reference.

BACKGROUND

1. Field

The described technology relates generally to an organic light emitting diode (OLED) display.

2. Description of the Related Technology

An organic light emitting diode (OLED) display includes two electrodes and an organic emission layer disposed between the two electrodes. Electrons injected from one electrode and holes injected from the other electrode are combined in the organic emission layer such that excitons are formed, and light is emitted by energy generated from the excitons.

The organic light emitting diode (OLED) display includes a plurality of pixels including an organic light emitting diode (OLED) as a self-light emitting element, and each pixel includes a plurality of thin film transistors (TFT) and a capacitor to drive the organic light emitting diode (OLED).

The capacitor includes a storage capacitor to store a data signal and a boosting capacitor performing a boosting operation according to a voltage change of a signal line for a further correction of expression of grayscales, and a luminance of the pixel including the storage capacitor and the boosting capacitor is changed according to a capacitance ratio of the two capacitors.

For uniform luminance, the capacitance ratio of the storage capacitor and the boosting capacitor must generally be uniform between a plurality of pixels.

However, the boosting capacitor is typically set to have smaller capacitance than the storage capacitor, and thereby a change amount according to a process distribution is relatively large. A luminance deviation and a color deviation may be generated by the capacitance deviation between the boosting capacitors included in a plurality of pixels.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The present invention provides an organic light emitting diode (OLED) display stably ensuring a boosting capacitance.

An organic light emitting diode (OLED) display according to an embodiment includes: a substrate; a scan line formed on the substrate applying a scan signal; a data line and a driving voltage line intersecting the scan line and respectively applying a data signal and a driving voltage; a switching TFT connected to the scan line and the data line; a driving TFT connected to a switching drain electrode of the switching TFT and the driving voltage line; an organic light emitting diode (OLED) connected to the driving drain electrode of the driving TFT; a storage capacitor connected between the driving voltage line and the driving gate electrode of the driving TFT; and a boosting capacitor including a first boosting capacitor plate connected to the driving gate electrode of the driving TFT and a second boosting capacitor plate overlapping the first boosting capacitor plate and connected to the scan line, wherein an area of the first boosting capacitor plate of the boosting capacitor is larger than an area of the second boosting capacitor plate.

The OLED display may further include an adjacent scan line formed on the substrate and applying an adjacent scan signal.

The storage capacitor may include a first storage capacitor plate formed on the same layer as the first boosting capacitor plate, and a second storage capacitor plate overlapping the first storage capacitor plate and connected to the common voltage line.

The first boosting capacitor plate may be formed on the same layer as the driving semiconductor layer of the driving TFT, and the second boosting capacitor plate may be formed on the same layer as the scan line.

The first boosting capacitor plate may be an extension extended from the first storage capacitor plate, and the second boosting capacitor plate may be a protrusion protruding from the scan line.

The first boosting capacitor plate may have a hammer shape, and the first boosting capacitor plate may include a grip parallel to the driving voltage line and a head formed at the end of the grip.

The protruding portion of the second boosting capacitor plate may be protruded upward and downward from the scan line.

The protruding portion of the second boosting capacitor plate may be positioned to entirely overlap inside the head of the first boosting capacitor plate.

A horizontal interval between a vertical outer line of the head of the first boosting capacitor plate and a vertical outer line of the protrusion of the second boosting capacitor plate may be in a range of about 1.2 μm to about 2 μm.

A vertical interval between the horizontal outer line of the head of the first boosting capacitor plate and a horizontal outer line of the protrusion of the second boosting capacitor plate may be in a range of about 1.2 μm to about 2 μm.

The first boosting capacitor plate may be an extension extended from the first storage capacitor plate, and the second boosting capacitor plate may be connected to a boosting connection line formed on the driving voltage line.

A gate insulating layer formed on the first boosting capacitor plate and an interlayer insulating layer covering the second boosting capacitor plate formed on the gate insulating layer may be further included, and the boosting connection line may be connected to the second boosting capacitor plate through a contact hole formed in the interlayer insulating layer.

The boosting connection line may be parallel to the scan line.

The data line and the driving voltage line may be respectively divided at a portion overlapping the boosting connection line, and the end of the data line and the end of the driving voltage line may be connected to each other through a data connector and a driving voltage connector.

The driving gate electrode of the driving TFT may be connected to the first storage capacitor plate through the storage connector.

The storage connector may include a first horizontal storage connector connected to the first storage capacitor plate through a contact hole formed in the interlayer insulating layer and the gate insulating layer, a vertical storage connector connected to the first horizontal storage connector through a contact hole formed in the interlayer insulating layer, and a second horizontal storage connector connected to the vertical storage connector through a contact hole formed in the interlayer insulating layer.

The second horizontal storage connector may be connected to the driving gate electrode through a contact hole formed in the interlayer insulating layer.

According to embodiments of the present invention, the area of the first boosting capacitor plate of the boosting capacitor is larger than the area of the second boosting capacitor plate such that the change ratio of the boosting capacitance caused by vertical and horizontal direction movement of the second boosting capacitor plate according to the manufacturing process distribution may be minimized.

Accordingly, a color deviation stain between a plurality of pixels may be improved.

DETAILED DESCRIPTION OF CERTAIN INVENTIVE EMBODIMENTS

Hereinafter, certain embodiments will be described in detail with reference to the accompanying drawings so that those skilled in the art to which the present invention pertains can be easily carried out. As those skilled in the art would realize, the described embodiments may be modified in various different ways, all without departing from the spirit or scope of the present invention.

To clearly explain the present invention, portions having no connection to the explanation are omitted, and the same or similar constituent elements are generally designated with the same reference numerals throughout the specification.

In addition, the size and thickness of each configuration shown in the drawings are not limited thereto.

In the drawings, the thickness of layers, films, panels, regions, etc., may be exaggerated for clarity. In the drawings, for better understanding and ease of description, thicknesses of some layers and areas may be excessively displayed. It will be understood that when an element such as a layer, film, region, or substrate is referred to as being "on" another element, it can be directly on the other element or intervening elements may also be present.

An organic light emitting diode (OLED) display according to one embodiment will be described with reference to FIG. 1 to FIG. 4.

Figure 1:
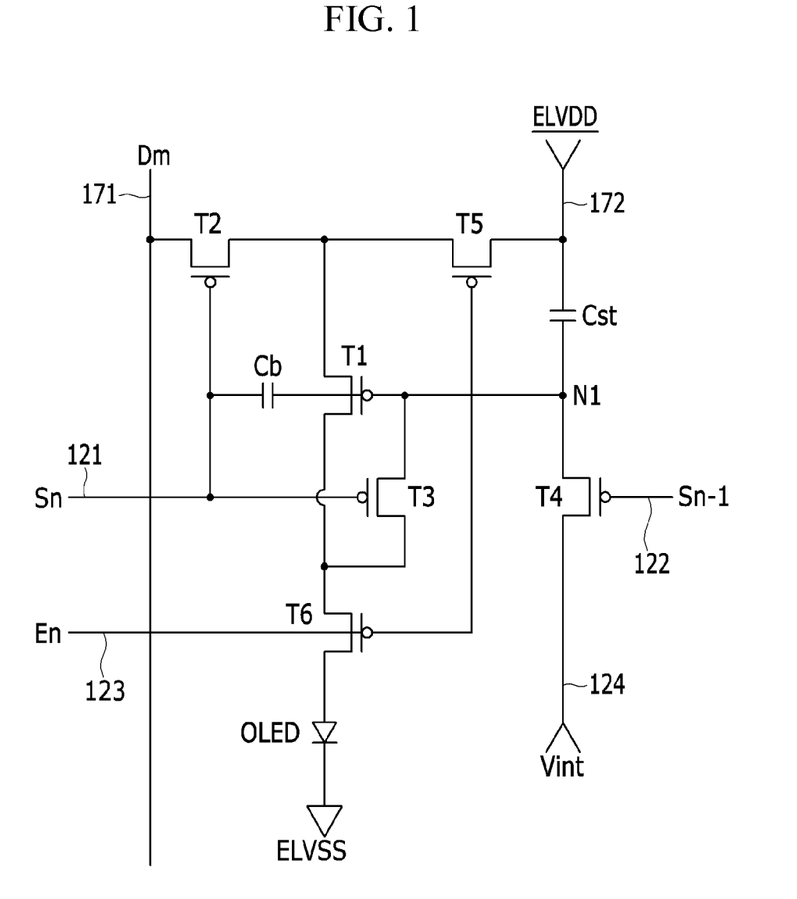
FIG. 1 is an equivalent circuit of one pixel of an organic light emitting diode (OLED) display according to one embodiment.

FIG. 1 is an equivalent circuit of one pixel of an organic light emitting diode (OLED) display according an embodiment.

As shown in FIG. 1, one pixel according of an organic light emitting diode (OLED) display according to one embodiment includes a plurality of signal lines 121, 122, 123, 124, 171, and 172, a plurality of thin film transistors (TFT) T1, T2, T3, T4, T5, and T6 connected to the plurality of signal lines, capacitors Cst and Cb, and an organic light emitting diode (OLED).

The TFTs include a driving TFT T1, a switching TFT T2, a compensation TFT T3, an initialization TFT T4, a first light emission control TFT T5, and a second light emission control TFT T6, and the capacitors Cst and Cb include a storage capacitor Cst and a boosting capacitor Cb.

As can be seen in FIG. 1, the signal lines include a scan line 121 transmitting a scan signal Sn, a adjacent scan line 122 transmitting a adjacent scan signal Sn-1 to the initialization thin TFT T4. The adjacent scan line 122 is a scan line from a pixel adjacent scan line to the pixel associated with the scan line 121. The signal lines further include a light emission control line 123 transmitting a light emission control signal En to the first light emission control TFT T5 and the second light emission control TFT T6, a data line 171 transmitting a data signal Dm and crossing the scan line 121, a driving voltage line 172 transmitting a driving voltage ELVDD and being substantially parallel to the data line 171, and an initialization voltage line 124 transmitting an initialization voltage Vint initializing the driving TFT T1.

The switching TFT T2 includes a gate electrode connected to the scan line 121, a source electrode connected to the data line 171, and a drain electrode connected to the source electrode of the driving TFT T1 and the driving voltage line 172. The switching TFT T2 performs a switching operation according to a scan signal transmitted through the scan line 121.

The driving TFT T1 receives a data signal according to the switching operation of the switching TFT T2 and supplies a driving current to the organic light emitting diode (OLED).

A gate electrode of the driving TFT T1 is connected to one end of the storage capacitor Cst, and the other end of the storage capacitor Cst is connected with the driving voltage line 172. In addition, the scan line 121 connected to a gate electrode of the switching TFT T2 is connected with one end of the boosting capacitor Cb, and the other end of the boosting capacitor Cb is connected with the gate electrode of the driving TFT T1.

The drain electrode of the driving TFT T1 is electrically connected with an anode of the organic light emitting diode (OLED). In addition, a cathode of the organic light emitting diode (OLED) is connected with a common voltage ELVSS. Thus, the organic light emitting diode (OLED) displays an image by emitting light with a driving current transmitted from the driving TFT T1.

Hereinafter, an operation process of one pixel of the OLED display according to one embodiment will be described in further detail.

First, while the initialization TFT T4 is in the turned-on state according to the adjacent scan signal Sn-1 transmitted through the adjacent scan line 122, one end of each of the storage capacitor Cst and the gate electrode of the driving TFT T1 is supplied with the initialization voltage Vint.

Next, the switching TFT T2 and the compensation TFT T3 are turned on according to the scan signal Sn transmitted through the scan line 121. While the switching TFT T2 and the compensation TFT T3 are in the turned-on state, the data signal Dm transmitted through the data line 171 is transmitted to the source electrode of the driving TFT T1 and the driving TFT T1 is diode-connected. Then, the gate electrode and the source electrode of the driving TFT T1 are applied with a voltage obtained by subtracting a threshold voltage of the driving TFT T1 from the data voltage.

Next, the first light emission control TFT T5 and the second light emission control TFT T6 are turned on by the light emission control signal En transmitted through the light emission control line 123, and a voltage at the gate electrode of the driving TFT T1 is boosted by an increase of the scan signal Sn transmitted through the scan line 121.

While the first light emission control TFT T5 and the second light emission control TFT T6 are in the turned-on state, the driving voltage ELVDD of the driving voltage line 172 is supplied to the source electrode of the driving TFT T1, and a driving current according to a voltage difference between the gate electrode and the source electrode flows to the driving TFT T1. The driving current is transmitted to the anode of the organic light emitting diode (OLED) through the turned on second light emission control TFT T6 such that the organic light emitting diode (OLED) emits light.

Now, a structure of one pixel of the OLED display shown in FIG. 1 will be described in further detail with reference to FIG. 2 to FIG. 4 as well as FIG. 1.

Figure 2:
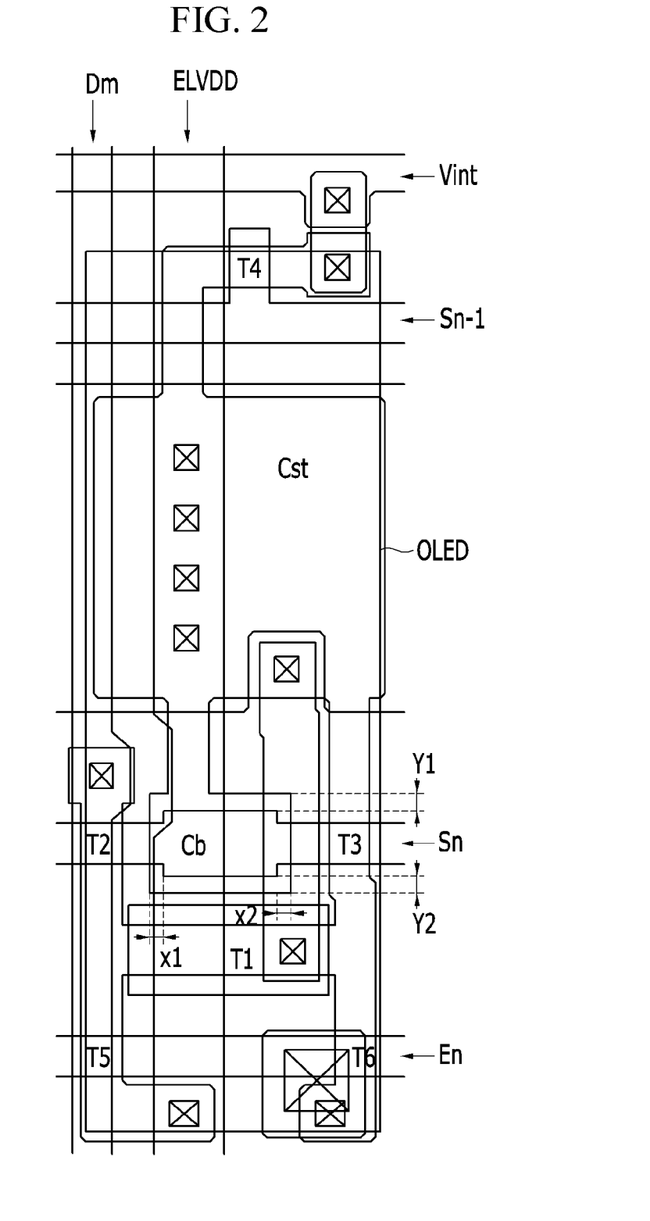
FIG. 2 is a schematic view showing a position of a plurality of TFTs and capacitors in one pixel of an organic light emitting diode (OLED) display according to one embodiment.
Figure 3:
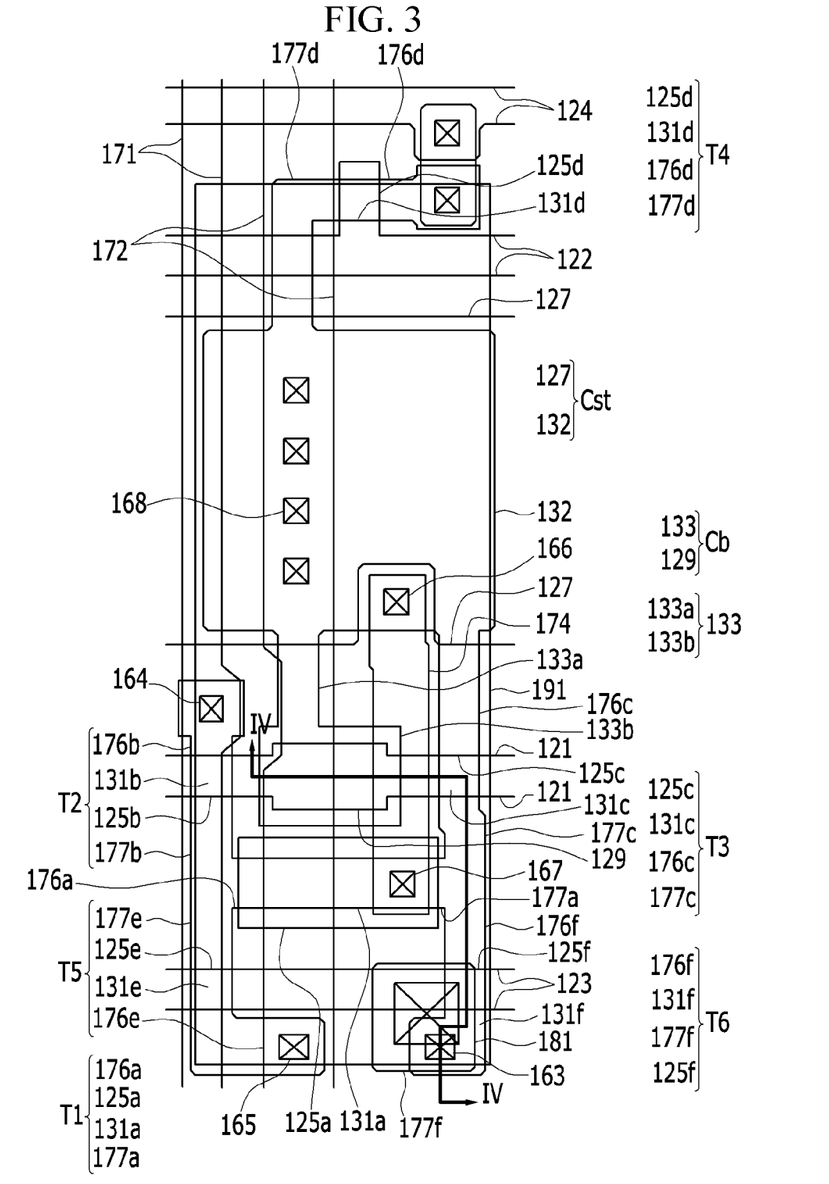
FIG. 3 is a layout view of a pixel of an organic light emitting diode (OLED) display according to one embodiment.
Figure 4:
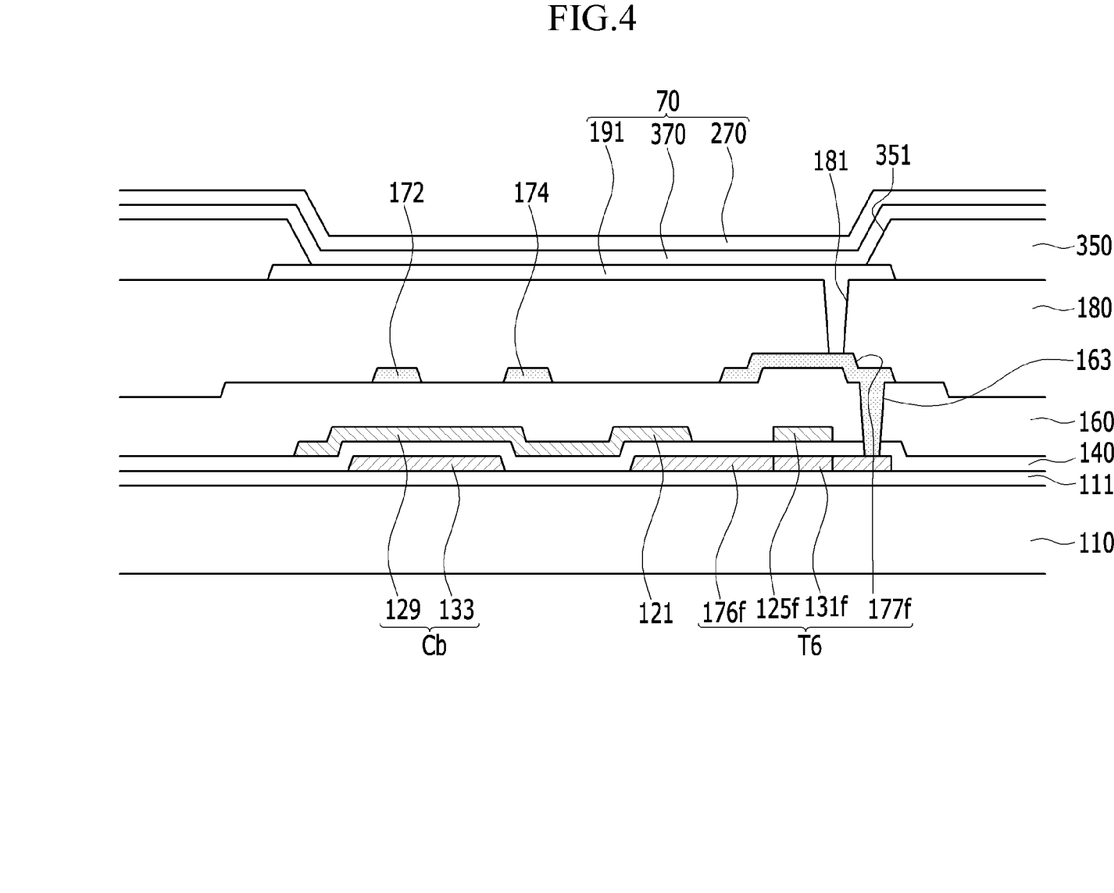
FIG. 4 is a cross-sectional view of the organic light emitting diode (OLED) display shown in FIG. 3 taken along the line IV-IV.

FIG. 2 is a schematic view showing a position of a plurality of TFTs and capacitors in one pixel of an organic light emitting diode (OLED) display according to one embodiment, FIG. 3 is a layout view of a pixel of an organic light emitting diode (OLED) display according to one embodiment, and FIG. 4 is a cross-sectional view of the organic light emitting diode (OLED) display shown in FIG. 3 taken along the line IV-IV.

As shown in FIG. 2 to FIG. 4, an embodiment of the pixel of the organic light emitting diode (OLED) display includes the scan line 121, the adjacent scan line 122, the light emission control line 123, and the initialization voltage line 124 formed in a row direction, and respectively applying the scan signal Sn, the adjacent scan signal Sn-1, the light emission control signal En, and the initialization voltage Vint. The pixel also includes the data line 171 and the driving voltage line 172 intersecting the scan line 121, the adjacent scan line 122, the light emission control line 123, and the initialization voltage line 124 and respectively applying the data signal Dm and the driving voltage ELVDD to the pixel.

The pixel also includes the driving TFT T1, the switching TFT T2, the compensation TFT T3, the initialization TFT T4, the first light emission control TFT T5, the second light emission control TFT T6, the storage capacitor Cst, the boosting capacitor Cb, and the organic light emitting diode (OLED) 70.

The driving TFT T1 includes a driving semiconductor layer 131a, a driving gate electrode 125a, a driving source electrode 176a, and a driving drain electrode 177a. The driving source electrode 176a corresponds to a driving source region of the driving semiconductor layer 131a, and the driving drain electrode 177a corresponds to a driving drain region of the driving semiconductor layer 131a.

The switching TFT T2 includes a switching semiconductor layer 131b, a switching gate electrode 125b, a switching source electrode 176b, and a switching drain electrode 177b.

The compensation TFT T3 includes a compensation semiconductor layer 131c, a compensation gate electrode 125c, a compensation source electrode 176c, and a compensation drain electrode 177c. The initialization TFT T4 includes an initialization semiconductor layer 131d, an initialization gate electrode 125d, an initialization source electrode 176d, and an initialization drain electrode 177d.

The first light emission control TFT T5 includes a first light emission control semiconductor layer 131e, a first light emission control gate electrode 125e, a first light emission control source electrode 176e, and a first light emission control drain electrode 177e. The second light emission control TFT T6 includes a second light emission control semiconductor layer 131f, a second light emission control gate electrode 125f, a second light emission control source electrode 176f, and a second light emission control drain electrode 177f.

The storage capacitor Cst includes a first storage capacitor plate 132 and a second storage capacitor plate 127 disposed with a gate insulating layer 140 interposed therebetween. Here, the gate insulating layer 140 is a dielectric material, and the storage capacitance of the storage capacitor Cst is determined according to a charge and the voltage between two capacitor plates 132 and 127.

The first storage capacitor plate 132 is formed on the same layer as the driving semiconductor layer 131a, the switching semiconductor layer 131b, the compensation semiconductor layer 131c, the first light emission control semiconductor layer 131e, and the second light emission control semiconductor layer 131f. The second storage capacitor plate 127 is formed on the same layer as the scan line 121 and the adjacent scan line 122.

The driving semiconductor layer 131a of the driving TFT T1 connects the switching semiconductor layer 131b and the compensation semiconductor layer 131c, and the first light emission control semiconductor layer 131e and the second light emission control semiconductor layer 131f, to each other.

Accordingly, the driving source electrode 176a is connected to the switching drain electrode 177b and the first light emission control drain electrode 177e, and the driving drain electrode 177a is connected to the compensation drain electrode 177c and the second light emission control source electrode 176f. The first light emission control source electrode 176e is connected to the source area of the first light emission control semiconductor layer 131e through a contact hole 165 formed in the an interlayer insulating layer 160 and the gate insulating layer 140.

The first storage capacitor plate 132 of the storage capacitor Cst is connected to the compensation source electrode 176c and the initialization drain electrode 177d, and is connected to the driving gate electrode 125a through a connector 174. The connector 174 is formed on the same layer as the data line 171. The connector 174 is connected to the first storage capacitor plate 132 through a contact hole 166 formed in an interlayer insulating layer 160 and the gate insulating layer 140, and is connected to the driving gate electrode 125a through a contact hole 167 formed in the interlayer insulating layer 160.

The second storage capacitor plate 127 of the storage capacitor Cst is connected to the common voltage line 172 and is substantially parallel to the scan line 121.

A first boosting capacitor plate 133 of the boosting capacitor Cb extends from the first storage capacitor plate 132, and a second boosting capacitor plate 129 has a portion which protrudes from the scan line 121 upward and downward.

The first boosting capacitor plate 133 has a hammer shape, and the first boosting capacitor plate 133 includes a grip 133a parallel to the driving voltage line 172 and a head 133b formed at the end of the grip 133a.

The protruding portion of the second boosting capacitor plate 129 is positioned to entirely overlap inside the head 133b of the first boosting capacitor plate 133. Accordingly, the area of the first boosting capacitor plate 133 of the boosting capacitor Cb is larger than the area of the second boosting capacitor plate 129.

Horizontal intervals X1 and X2 between a vertical outer line of the head 133b of the first boosting capacitor plate 133 and a vertical outer line of the protruding portion of the second boosting capacitor plate 129 may be in a range of about 1.2 µm to about 2 µm, and vertical intervals Y1 and Y2 between the horizontal outer line of the head 133b of the first boosting capacitor plate 133 and the horizontal outer line of the protruding portion of the second boosting capacitor plate 129 may be in a range of about 1.2 µm to about 2 µm.

As described above, the area of the first boosting capacitor plate 133 of the boosting capacitor Cb is larger than the area of the second boosting capacitor plate 129 such that a change ratio of the boosting capacitance may be minimized even if movement in the vertical direction of the second boosting capacitor plate 129 by the manufacturing process distribution is generated. Accordingly, a color deviation stain generated between a plurality of pixels may be improved.

The switching TFT T2 is used as a switching element for selecting a pixel for light emission. The switching gate electrode 125b is connected to the scan line 121. The switching source electrode 176b is connected to the data line 171. The switching drain electrode 177b is connected with the driving TFT T1 and the first light emission control TFT T5.

The second light emission control drain electrode 177f of the second light emission control TFT T6 is directly connected with a pixel electrode 191 of the organic light emitting diode 70 through a contact hole 181 of a protective layer 180.

Next, referring to FIG. 4, a structure of the organic light emitting diode (OLED) display according to one embodiment will be described.

In particular, a structure of a TFT will be described based on the second light emission control TFT T6. In addition, the other TFTs T1, T2, T3, T4, and T5 are similar to the second light emission control TFT T6 in layering structure, and therefore no further description for the TFTs T1, T2, T3, T4, and T5 will be provided.

A buffer layer 111 is formed on a substrate 110, and the second light emission control semiconductor layer 131f and the first boosting capacitor plate 133 forming the boosting capacitor Cb are formed on the buffer layer 111. The substrate 110 is formed of an insulating substrate made of glass, quartz, ceramic, plastic, and the like. The second light emission control semiconductor layer 131f and the first boosting capacitor plate 133 are formed of a polysilicon layer. In addition, the second light emission control semiconductor layer 131f includes a channel area that is not doped with an impurity and a source area and a drain area that are p+ doped at both sides of the channel area. The impurity may be selected according to the type of the TFT.

The gate insulation layer 140 formed of silicon nitride (SiNx) or silicon oxide (SiO2) is formed on the second light emission control semiconductor layer 131f.

A gate wire including the scan line 121 including the switching gate electrode 125b and the compensation gate electrode 125c, the adjacent scan line 122 including the initialization gate electrode 125d and the driving gate electrode 125a, and the light emission control line 123 including the second light emission control gate electrode 125f are formed on the gate insulating layer 140. The second light emission control gate electrode 125f is formed to be overlapped with at least a part, such as for example, the channel area, of the second light emission control semiconductor layer 131f. The gate wire further includes the second storage capacitor plate 127 forming the storage capacitor Cst and the second boosting capacitor plate 129 forming the boosting capacitor Cb.

The second storage capacitor plate 127 is connected to the driving voltage line 172 through a contact hole 168, and the second boosting capacitor plate 129 is connected to the scan line 121.

The interlayer insulating layer 160 that covers the second light emission control gate electrode 125e is formed on the gate insulating layer 140. The gate insulating layer 140 and the interlayer insulating layer 160 include a contact hole 163 exposing a drain area of the second light emission control semiconductor layer 131f. Like the gate insulating layer 140, the interlayer insulating layer 160 is formed using a ceramic-based material such as silicon nitride (SiNx) or silicon oxide (SiO2).

A data wire including the data line 171 that includes the switching source electrode 176b, the connector 174, the second light emission control drain electrode 177f, and the driving voltage line 172 are formed on the interlayer insulating layer 160.

In addition, the switching source electrode 176b and the second light emission control drain electrode 177f are respectively connected with the source area of the switching semiconductor layer 131b and the drain area of the second light emission control semiconductor layer 131f through contact holes 163 and 164 respectively formed in the interlayer insulating layer 160 and the gate insulating layer 140.

The protective layer 180 that covers the data wires 171, 174, 177f, and 172 is formed on the interlayer insulating layer 160, and the pixel electrode 191 is formed on the protective layer 180. The pixel electrode 191 is connected with the second light emission control drain electrode 177f through the contact hole 181 formed in the protective layer 180.

A barrier rib 350 is formed on an edge of the pixel electrode 191 and the protective layer 180, and the barrier rib 350 includes a barrier rib opening 351 that exposes the pixel electrode 191. The barrier rib 350 may be formed of a resin such as a polyacrylate resin and a polyimide, or a silica-based inorganic material.

An organic emission layer 370 is formed on the pixel electrode 191 exposed through the barrier rib opening 351, and a common electrode 270 is formed on the organic emission layer 370. In this way, the organic light emitting diode 70 including the pixel electrode 191, the organic emission layer 370, and the common electrode 270 is formed.

Here, the pixel electrode 191 is an anode which is a hole injection electrode, and the common electrode 270 is a cathode which is an electron injection electrode. Embodiments of the invention are not limited thereto, and the pixel electrode 191 may be a cathode and the common electrode 270 may be an anode according to a driving method of the OLED display. Holes and electrons are injected from the pixel electrode 191 and the common electrode 270 into the organic light emitting layer 370, and when excitons formed as the holes and electrons injected into the organic light emitting layer 370 are combined change from an excited state to a base state, the organic light emitting layer 370 emits light.

The organic emission layer 370 is formed of a low molecular organic material or a high molecular organic material such as poly(3,4-ethylenedioxythiophene) (PEDOT). In addition, the organic emission layer 370 may be formed of a multilayer including at least one of an emission layer, a hole injection layer (HIL), a hole transport layer (HTL), an electron transport layer (ETL), and an electron injection layer (EIL). When the organic emission layer 370 includes all the above-stated layers, the hole injection layer (HIL) is disposed on the pixel electrode 191 which is a hole injection electrode, and the hole transport layer (HTL), the emission layer, the electron transport layer (ETL), and the electron injection layer (EIL) are sequentially layered thereon. Since the common electrode 270 is formed of a reflective conductive material, the OLED display is formed as a bottom emission type of OLED display. The reflective material may include lithium (Li), calcium (Ca), fluoride lithium/calcium (LiF/Ca), lithium fluoride/aluminum (LiF/Al), aluminum (Al), silver (Ag), magnesium (Mg), and gold (Au).

In some embodiments, a portion of the scan line is formed of the second boosting capacitor plate 129 of the boosting capacitor Cb. In other embodiments, an additional boosting connection line may be connected to the second boosting capacitor plate 129 to minimize parasitic capacitance by the scan line.

Next, another embodiment will be described with reference to FIG. 5 and FIG. 6.

Figure 5:
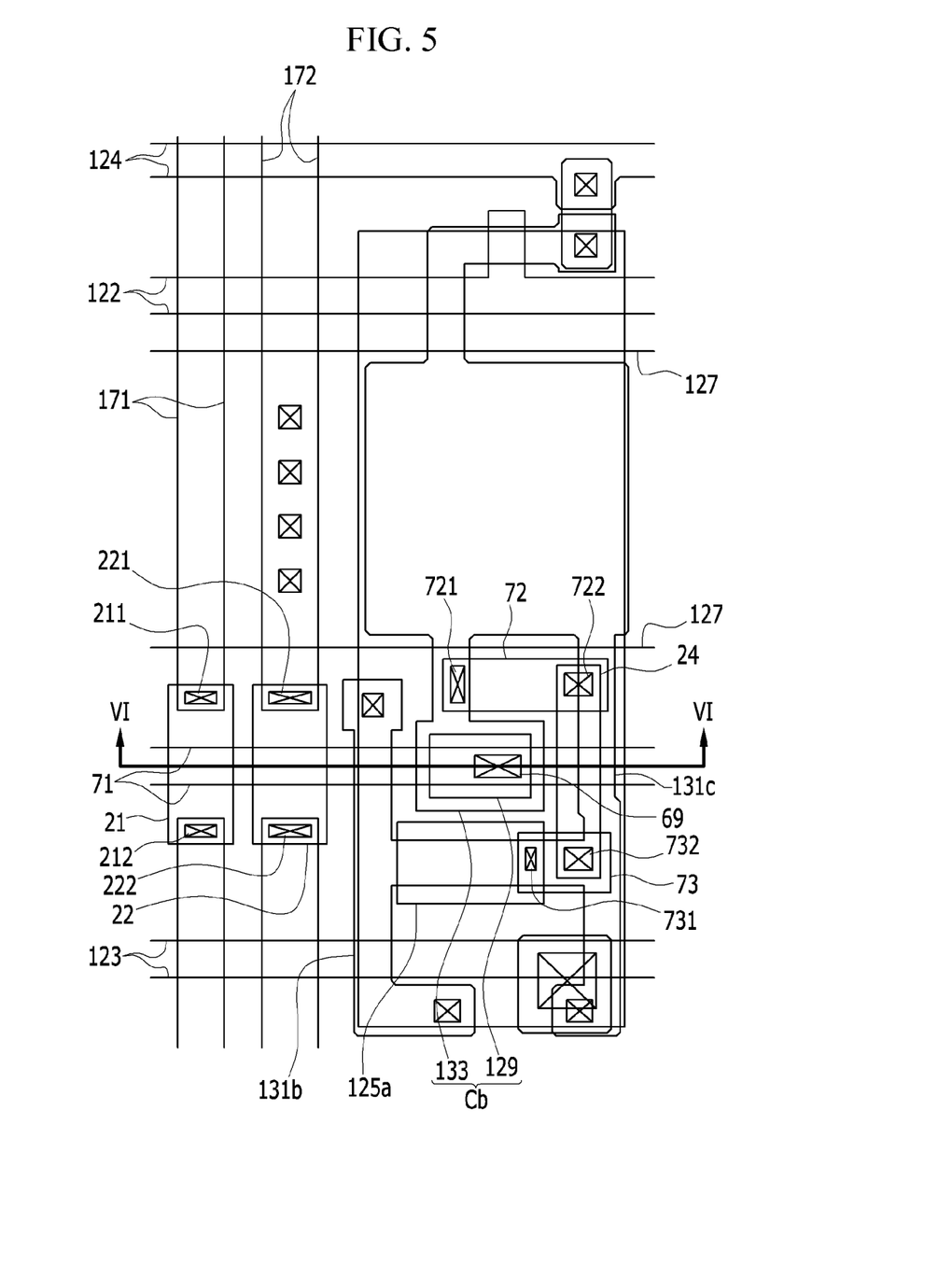
FIG. 5 is a layout view of a pixel of an organic light emitting diode (OLED) display according to another embodiment.
Figure 6:
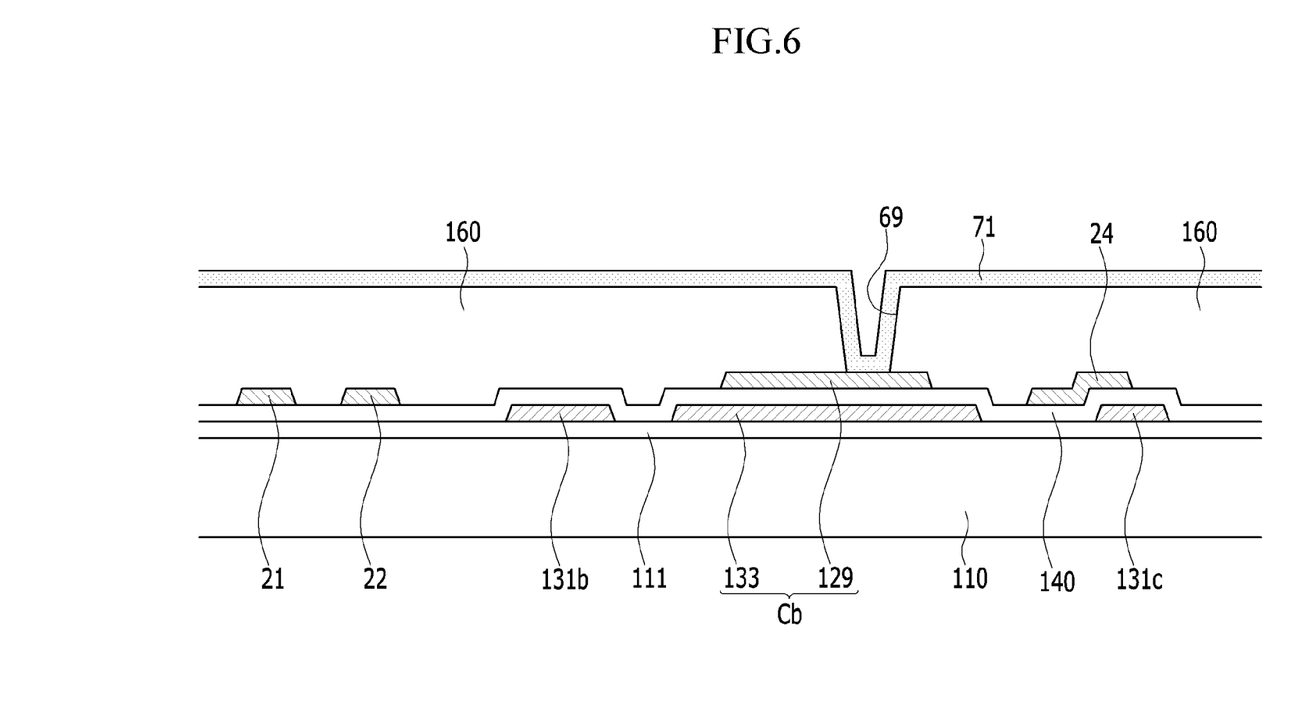
FIG. 6 is a cross-sectional view of the organic light emitting diode (OLED) display shown in FIG. 5 taken along the line VI-VI.

FIG. 5 is a layout view of a pixel of an organic light emitting diode (OLED) display according to another embodiment, and FIG. 6 is a cross-sectional view of the organic light emitting diode (OLED) display shown in FIG. 5 taken along the line VI-VI.

The embodiment shown in FIG. 5 and FIG. 6 is substantially equivalent to the embodiment shown in FIG. 1 to FIG. 4 except for an additional boosting connection line connected to the second boosting capacitor plate, and as such, the common description is omitted.

As shown in FIG. 5 and FIG. 6, in the organic light emitting diode (OLED) display, the first boosting capacitor plate 133 of the boosting capacitor Cb is the extension extended from the first storage capacitor plate 132, and the second boosting capacitor plate 129 is connected to a boosting connection line 71 formed on the same layer as the driving voltage line 172.

The boosting connection line 71 is connected to the second boosting capacitor plate 129 through a contact hole 69 formed in the interlayer insulating layer 160, and the boosting connection line 71 is formed in parallel to the scan line 121.

The data line 171 and the driving voltage line 172 are separated at the portion overlapping the boosting connection line 71. The end of the data line 171 and the end of the driving voltage line 172 are connected to each other through a data connector 21 and a driving voltage connector 22 that are respectively formed on the same layer as the scan line 121.

The divided end of the data line 171 is connected to the data connector 21 through contact holes 211 and 212 of the interlayer insulating layer 160, and the divided end of the driving voltage line 172 is connected to the driving voltage connector 22 through contact holes 221 and 222 formed in the interlayer insulating layer 160.

The driving gate electrode 125a of the driving TFT is connected to the first storage capacitor plate 132 through storage connectors 72, 73, and 24.

The storage connectors 72, 24, and 73 include a first horizontal storage connector 72 connected to the first storage capacitor plate 132 through a contact hole 721 formed in the interlayer insulating layer 160 and the gate insulating layer 140, a vertical storage connector 24 connected to the first horizontal storage connector 72 through a contact hole 722 formed in the interlayer insulating layer 160, and a second horizontal storage connector 73 connected to the vertical storage connector 24 through a contact hole 732 formed in the interlayer insulating layer 160.

The second horizontal storage connector 73 is connected to the driving gate electrode 125a through a contact hole 731 formed in the interlayer insulating layer 160.

The first horizontal storage connector 72 and the second horizontal storage connector 73 are formed on the same layer as the data line 171, and the vertical storage connector 24 is formed on the same layer as the scan line 121.

As described above, in some embodiments of the organic light emitting diode (OLED) display, the boosting connection line 71 is separately connected to the second boosting capacitor plate 129 such that the parasitic capacitance by the scan line 121 may be minimized. The boosting connection line 71 is formed on the same layer as the data line 171, and thereby the interval between the boosting connection line 71 and the first boosting capacitor plate 133 is increased such that the parasitic capacitance by the overlapping of the boosting connection line 71 and the first boosting capacitor plate 133 may be minimized. Accordingly, the change ratio of the boosting capacitance may be minimized even if the second boosting capacitor plate is moved by the manufacturing process distribution in the vertical direction and the horizontal direction.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| 110: substrate | 121: scan line |
|---|---|
| 127: second storage capacitor plate | 129: second boosting capacitor plate |
| 132: first storage capacitor plate | 133: first boosting capacitor plate |

What is claimed is:

1. An organic light emitting diode (OLED) display comprising:
    a substrate;
    a scan line formed on the substrate and applying a scan signal;
    a data line and a driving voltage line intersecting the scan line and respectively applying a data signal and a driving voltage;
    a switching thin film transistor (TFT) connected to the scan line and the data line;
    a driving TFT connected to a switching drain electrode of the switching TFT and the driving voltage line;
    an OLED connected to the driving drain electrode of the driving TFT;
    a storage capacitor connected between the driving voltage line and the driving gate electrode of the driving TFT; and
    a boosting capacitor including a first boosting capacitor plate connected to the driving gate electrode of the driving TFT and a second boosting capacitor plate overlapping the first boosting capacitor plate and connected to the scan line,
    wherein the first boosting capacitor plate has a hammer shape, and the first boosting capacitor plate includes a grip parallel to the driving voltage line and a head formed at the end of the grip, wherein the second boosting capacitor plate is a protrusion protruding upward and downward from the scan line and wherein the protrusion of the second boosting capacitor plate is positioned to entirely overlap inside the head of the first boosting capacitor plate,
    wherein an area of the first boosting capacitor plate of the boosting capacitor is larger than an area of the second boosting capacitor plate, and wherein a first horizontal interval between a first vertical outer line of the head of the first boosting capacitor plate and a first vertical outer line of the protrusion of the second boosting capacitor plate is in a range of about 1.2 μm to about 2 μm, wherein a second horizontal interval between a second vertical outer line of the head of the first boosting capacitor plate and a second vertical outer line of the protrusion of the second boosting capacitor plate is the same as the first horizontal interval, wherein the second vertical outer line of the head of the first boosting capacitor plate is parallel and opposite to the first vertical outer line of the head of the first boosting capacitor plate, and wherein the second vertical outer line of the protrusion of the second boosting capacitor plate is parallel and opposite to the first vertical outer line of the protrusion of the second boosting capacitor plate.

2. The OLED display of claim 1, further comprising an adjacent scan line formed on the substrate and applying an adjacent scan signal.

3. The OLED display of claim 1, wherein the storage capacitor includes:
   a first storage capacitor plate formed on the same layer as the first boosting capacitor plate, and
   a second storage capacitor plate overlapping the first storage capacitor plate and connected to a common voltage line.

4. The OLED display of claim 3, wherein
   the first boosting capacitor plate is formed on the same layer as the driving semiconductor layer of the driving TFT, and
   the second boosting capacitor plate is formed on the same layer as the scan line.

5. The OLED display of claim 4, wherein the first boosting capacitor plate is an extension extended from the first storage capacitor plate.

6. The OLED display of claim 4, wherein
   the first boosting capacitor plate is an extension extended from the first storage capacitor plate, and the second boosting capacitor plate is connected to a boosting connection line formed on the driving voltage line.

7. The OLED display of claim 6, further comprising:
a gate insulating layer formed on the first boosting capacitor plate; and
an interlayer insulating layer covering the second boosting capacitor plate formed on the gate insulating layer,
wherein the boosting connection line is connected to the second boosting capacitor plate through a contact hole formed in the interlayer insulating layer.

8. The OLED display of claim 7, wherein
the boosting connection line is parallel to the scan line.

9. The OLED display of claim 8, wherein:
the data line and the driving voltage line are respectively divided at a portion overlapping the boosting connection line; and
the end of the data line and the end of the driving voltage line are connected to each other through a data connector and a driving voltage connector.

10. The OLED display of claim 9, wherein
the driving gate electrode of the driving TFT is connected to the first storage capacitor plate through the storage connector.

11. The OLED display of claim 10, wherein
the storage connector includes:
   a first horizontal storage connector connected to the first storage capacitor plate through a contact hole formed in the interlayer insulating layer and the gate insulating layer;
   a vertical storage connector connected to the first horizontal storage connector through a contact hole formed in the interlayer insulating layer; and
   a second horizontal storage connector connected to the vertical storage connector through a contact hole formed in the interlayer insulating layer.

12. The OLED display of claim 11, wherein
the second horizontal storage connector is connected to the driving gate electrode through a contact hole formed in the interlayer insulating layer.

13. The OLED display of claim 1, wherein
a vertical interval between the horizontal outer line of the head of the first boosting capacitor plate and the horizontal outer line of the protrusion of the second boosting capacitor plate is in a range of about 1.2 μm to about 2 μm.

* * * * *